(12) United States Patent
Lee et al.

(10) Patent No.: US 10,945,340 B2
(45) Date of Patent: Mar. 9, 2021

(54) METHOD FOR MANUFACTURING DISPLAY DEVICE

(71) Applicant: Samsung Display Co., Ltd., Yongin-si (KR)

(72) Inventors: Jae Woo Lee, Hwaseong-si (KR); Jung Min Lee, Suwon-si (KR); Jin Woo Kim, Suwon-si (KR); Hong Ju Mun, Seongnam-si (KR); Seung Joo Lee, Seongnam-si (KR); Myung Gil Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 147 days.

(21) Appl. No.: 15/665,348

(22) Filed: Jul. 31, 2017

(65) Prior Publication Data

US 2018/0070455 A1    Mar. 8, 2018

(30) Foreign Application Priority Data

Sep. 5, 2016    (KR) ........................ 10-2016-0113788

(51) Int. Cl.
| | | |
|---|---|---|
| *H05K 3/02* | (2006.01) | |
| *H05K 3/10* | (2006.01) | |
| *H05K 3/22* | (2006.01) | |
| *H05K 1/02* | (2006.01) | |
| *G06F 1/16* | (2006.01) | |
| *H05K 3/36* | (2006.01) | |
| *G02F 1/1333* | (2006.01) | |
| *H05K 1/18* | (2006.01) | |
| *G02F 1/13* | (2006.01) | |

(52) U.S. Cl.
CPC ............. *H05K 3/22* (2013.01); *G06F 1/1652* (2013.01); *H05K 1/028* (2013.01); *H05K 3/361* (2013.01); *G02F 1/1303* (2013.01); *G02F 1/133305* (2013.01); *H05K 1/189* (2013.01); *H05K 2201/055* (2013.01); *H05K 2201/10128* (2013.01)

(58) Field of Classification Search
CPC .......... H05K 3/22; H05K 3/361; H05K 1/028; H05K 1/189; G06F 1/1652; G02F 1/1303; G02F 1/133305
See application file for complete search history.

(56) References Cited

U.S. PATENT DOCUMENTS

| | | | |
|---|---|---|---|
| 6,334,350 B1 | 1/2002 | Shin et al. | |
| 8,323,066 B2 * | 12/2012 | Kim | ...................... G02F 1/1303 156/156 |
| 8,481,364 B2 * | 7/2013 | Chao | ................... H01L 21/4846 257/734 |

(Continued)

FOREIGN PATENT DOCUMENTS

| | | |
|---|---|---|
| CN | 1250516 | 4/2000 |
| CN | 1292738 | 4/2001 |

(Continued)

*Primary Examiner* — Paul D Kim
(74) *Attorney, Agent, or Firm* — H.C. Park & Associates, PLC

(57) ABSTRACT

According to exemplary embodiments, a method for manufacturing a display device may include providing a bending object on a stage, bending the bending object by bringing a bending bar into contact with the bending object, and measuring a movement route of the bending bar.

18 Claims, 19 Drawing Sheets

(56) References Cited

U.S. PATENT DOCUMENTS

| | | | |
|---|---|---|---|
| 8,481,859 B2* | 7/2013 | Haq | H05K 1/0271 |
| | | | 156/230 |
| 8,804,349 B2* | 8/2014 | Lee | G06F 1/1641 |
| | | | 361/749 |
| 9,010,899 B2 | 4/2015 | Harjee et al. | |
| 9,224,952 B2 | 12/2015 | Harjee et al. | |
| 9,352,561 B2 | 5/2016 | Harjee et al. | |
| 9,990,055 B2 | 6/2018 | Seo et al. | |
| 10,289,372 B2* | 5/2019 | Ahn | G01B 7/30 |
| 2014/0111954 A1* | 4/2014 | Lee | G06F 1/1641 |
| | | | 361/749 |
| 2015/0248144 A1* | 9/2015 | Hong | G06F 1/3265 |
| | | | 361/679.27 |
| 2015/0373305 A1 | 12/2015 | Hauf et al. | |
| 2016/0066409 A1 | 3/2016 | Kwon et al. | |
| 2016/0133881 A1 | 5/2016 | Harjee et al. | |
| 2016/0311219 A1 | 10/2016 | Harjee et al. | |

FOREIGN PATENT DOCUMENTS

| | | |
|---|---|---|
| CN | 101290445 | 10/2008 |
| CN | 101750018 | 6/2010 |
| CN | 104737469 | 6/2015 |
| CN | 104952373 | 9/2015 |
| KR | 10-2013-0011263 | 1/2013 |
| KR | 10-2014-0139825 | 12/2014 |
| KR | 10-2015-0096806 | 8/2015 |
| WO | 2016/004125 | 1/2016 |
| WO | 2016/036646 | 3/2016 |

\* cited by examiner

Fig. 11

|  | X | | Y | | Z | | θ | |
|---|---|---|---|---|---|---|---|---|
|  | designation | current | designation | current | designation | current | designation | current |
| P1 | 1 | 0 | 1 | 1 | 1 | 0 | 55 | 55 |
| P2 | 2 | 1 | 2 | 2 | 2 | 1 | 56 | 56 |
| P3 | 3 |  | 3 |  | 3 |  | 57 |  |
| P4 | 4 |  | 4 |  | 4 |  | 58 |  |
| P5 | 5 |  | 5 |  | 5 |  | 59 |  |
| P6 | 6 |  | 6 |  | 6 |  | 60 |  |
| P7 | 7 |  | 7 |  | 7 |  | 61 |  |

METHOD FOR MANUFACTURING DISPLAY DEVICE

CROSS-REFERENCE TO RELATED APPLICATION

This application claims priority from and the benefit of Korean Patent Application No. 10-2016-0113788 filed on Sep. 5, 2016, which is hereby incorporated by reference for all purposes as if fully set forth herein.

BACKGROUND

Field

Exemplary embodiments relate to a bending apparatus and a method for manufacturing a display device using the same.

Discussion of the Background

Electronic devices, such as mobile phones, notebook computers, personal digital assistants, tablets, etc, are widely used. Recently, electronic devices based on mobility, such as mobile phones and tablets have been widely used.

These devices typically include display devices, such as a liquid crystal display (LCD) and an organic light emitting display (OLED), etc, for providing users with visual information such as images and video to support various functions. Recently, with a decrease in size of other components for driving the display device, there has been a tendency for a gradual increase in a proportion of the electronic device occupied by the display device, and a structure capable of being bent from a flat state to have a given angle has also been developed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a bending apparatus that minimizes damage to a bending object during a bending process.

Exemplary embodiments provide a method of manufacturing a display device that minimizes damage to a bending object during a bending process.

Additional aspects will be set forth in the detailed description which follows, and, in part, will be apparent from the disclosure, or may be learned by practice of the inventive concept.

Exemplary embodiments provide a method for manufacturing a display device, the method including providing a bending object on a stage, bending the bending object by bringing a bending bar into contact with the bending object, and measuring a movement route of the bending bar.

The movement route of the bending bar may include an acceleration section in which a moving speed of the bending bar increases, and a constant speed section in which the moving speed of the bending bar is constant.

The measuring the movement route of the bending bar may include measuring the movement route of the bending bar in the constant speed section.

The bending of the bending object may include moving the bending bar along a standard route, and the method may further include comparing the measured movement route with the standard route.

The method may further include moving the bending bar according to a corrected movement route when the measured movement route deviates from the standard route.

The moving the bending bar according to the corrected movement route may be performed in real time, while bending the bending object.

The measured movement route may include at least one coordinate indicating a position of the bending bar, and the corrected movement route may include at least one target coordinate.

The bending object may be a film member on which electronic elements are mounted.

The bending object may include a panel, and a flexible printed circuit board attached to the panel.

The bending bar may contact the flexible printed circuit board.

The bending object may include a panel, and a window disposed on the panel.

The bending bar may contact the panel.

The bending bar may contact the window.

Exemplary embodiments provide a bending apparatus including a stage on which a bending object is positioned, a bending bar, a drive unit connected to the bending bar and configured to move the bending bar according to a standard route to bend the bending object by coming into contact with the bending object, and a measuring unit that measures a movement route of the bending bar.

The bending apparatus may further include a control unit that determines a corrected movement route on a basis of the movement route measured by the measuring unit, and the driving unit that drives the bending bar under control of the control unit to move to bend the bending object according to the corrected movement route.

The measured movement route may include at least one coordinate indicating a position of the bending bar, and the control unit may determine at least one target coordinate as the corrected movement route.

Exemplary embodiments provide a method of manufacturing a display device, the method including providing a bending object on a stage, moving a bending bar along at least a portion of a given route to bend the bending object, the bending bar contacting the bending object, measuring a movement route of the bending bar when the bending bar moves, and correcting the given route with a corrected movement route based on the measured movement route.

The given route may include first coordinates and second coordinates, and the moving the bending bar may include moving the bending bar along the first coordinates.

The method may further include moving the bending bar according to third coordinates of the corrected route, the third coordinates corresponding to the second coordinates.

The method may further include moving the bending bar according to first coordinates of the corrected route. The given route may include second coordinates, and the first coordinates corresponds to the second coordinates.

According to exemplary embodiments, damage to the bending object during the bending process may be minimized. The process efficiency may be improved by reducing the damage to the bending object.

Effects according to an exemplary embodiment of the present inventive concept are not limited by the contents mentioned above, and further various effects are included herein.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 11 is a table illustrating coordinates of measurement points.

DETAILED DESCRIPTION OF THE ILLUSTRATED EMBODIMENTS

Figure 1:
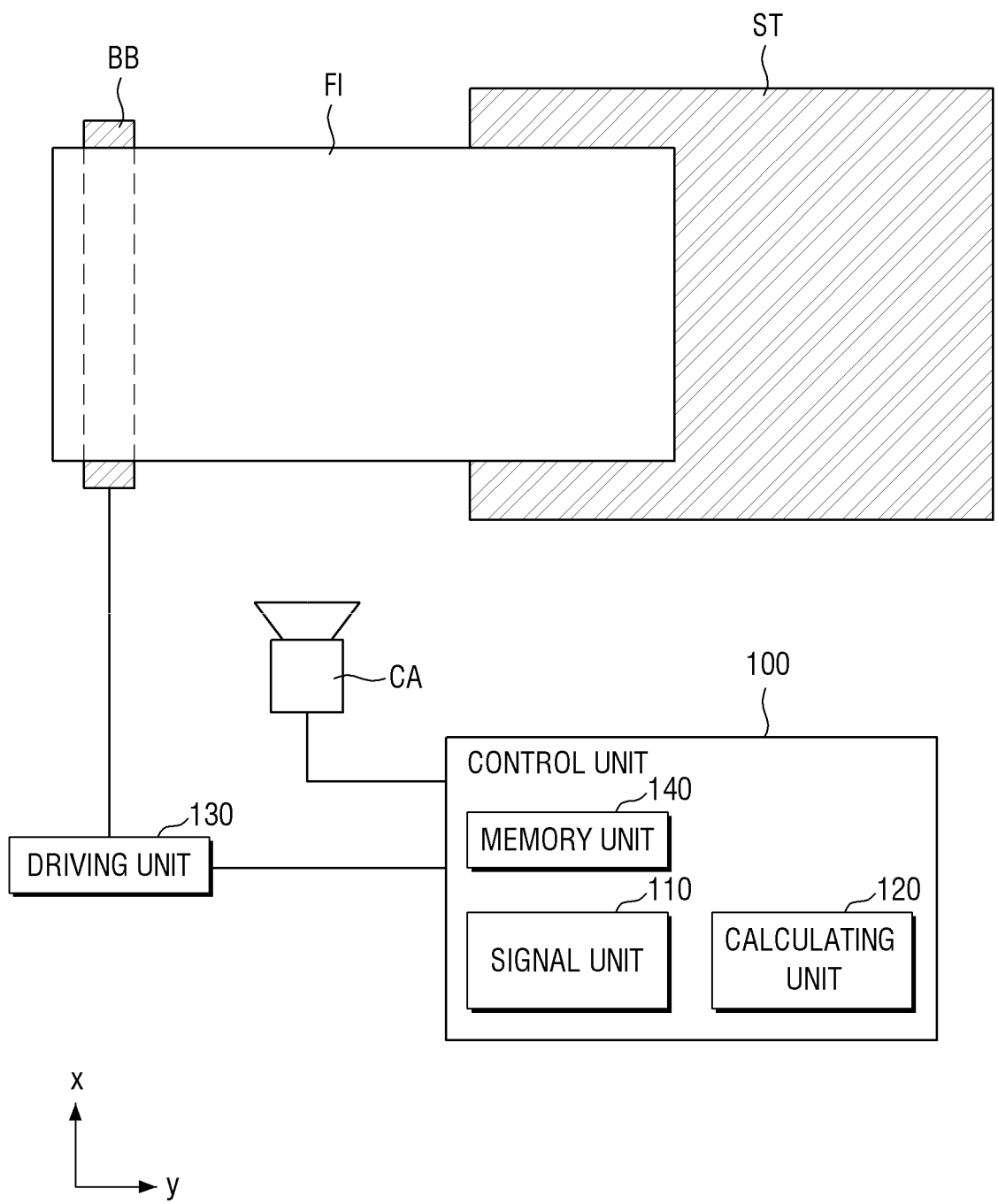
FIG. 1 is a top view of a bending apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," "top," "side," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
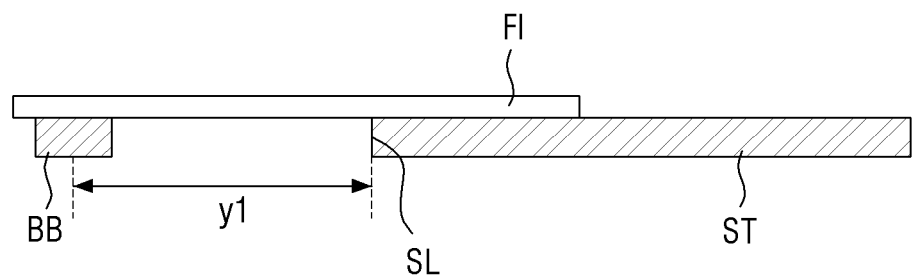
FIG. 2 is a side view of the bending apparatus according to the exemplary embodiment of FIG. 1.
Figure 2:
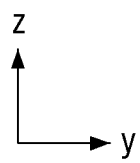

FIG. 1 is a top view of a bending apparatus according to an exemplary embodiment. FIG. 2 is a side view of the bending apparatus according to the exemplary embodiment of FIG. 1.

Referring to FIGS. 1 and 2, the bending apparatus according to an exemplary embodiment includes a stage ST on which at least a portion of a bending object (i.e., the object to be bent, such as a display component as described below) is placed, a bending bar BB that comes into contact with one side of the bending object to bend a film member FI, and a measuring unit CA (e.g., a camera) that measures the movement route of the bending bar BB.

The stage ST may provide a space on which the bending object is seated. The stage ST may fix portions of the bending object.

The bending object is capable of deformation (e.g., bending) and flexibility. The bending object may be a thin plate-shaped member. For example, the bending object may include the film member FI on which the electronic elements are mounted. The electronic elements, for example, may include a signal line, a pad, an electrode, and the like. However, the exemplary embodiments are not limited thereto, and the bending object may be one of suitable members which have flexibility. For example, the bending object may include a display panel for the display device, a touch screen panel (TSP), a flexible printed circuit board (FPC), a touch unit and the like.

The stage ST may fix at least a part of one side of the film member FI. That is, a part of the film member FI may overlap the stage ST, and the remainder may not overlap the stage ST.

The bending bar BB may be disposed on one side of the film member FI. The bending bar BB may have a bar shape and may extend in the longitudinal direction. The bending bar BB, for example, may extend in an x-axis direction in FIG. 1.

The bending bar BB may be in contact with one side of the film member FI. The length of the bending bar BB may be greater than a width of the film member FI. However, the exemplary embodiments are not limited thereto, and the length of the bending bar BB may be shorter than or equal to the width of the film member FI without departing from the scope of the inventive concept.

The bending bar BB may fix the film member FI. The bending bar BB may fix the film member FI, for example, by utilizing a vacuum suction method or an adhesion method. However, these are merely an example, and the fixing method of the bending bar BB is not limited thereto.

In an exemplary embodiment, the bending bar BB is attached to one side of the film member FI, but is not limited thereto, and the bending bar BB may also be attached on the other side of the film member FI in another exemplary embodiment. However, hereinafter, the description will be given of a case where the bending bar BB comes into contact with one side of the film member FI for descriptive convenience.

A portion of the one side of the film member FI is fixed to the bending bar BB, and another portion thereof may be fixed to the stage ST. In this state, the film member FI may be bent by movement of the bending bar B. Detailed description thereof will be described with reference to FIG. 3.

The measuring unit CA may be positioned beside the bending bar BB to measure the movement route of the bending bar BB.

The bending apparatus may further include a control unit 100 which controls the measuring unit CA and/or the bending bar BB. The control unit 100 may include a memory unit 140, a signal unit 110, and a calculating unit 120.

The memory unit 140 may store a standard route. The memory unit 140 may further store the movement route of the bending bar BB measured by the measuring unit CA. The damage to the bending area BA of the film member FI may differ depending on the movement route of the bending bar BB. The standard route may be experimentally derived, or may be a value of an ideal route. The standard route may be input and stored in the memory unit 140 before measuring the movement route of the bending bar BB. The standard route may be updated based on the measured movement route of the bending bar BB in an exemplary embodiment.

The signal unit 110 may provide a start signal and a termination signal to the measuring unit CA. The measuring unit CA may start the measurement of the movement route of the bending bar BB by receiving the start signal of the signal unit 110, and may terminate the measurement by receiving the termination signal of the signal unit 110.

The calculating unit 120 may compare the standard route with the movement route of the bending bar BB measured by the measuring unit CA, or may compare the movement routes of two or more bending bars BB measured by the measuring unit CA.

A driving unit 130 may move, in response to control signals transferred from the control unit 100, the bending bar BB to bend the film member FI in the bending process.

The control unit 100 may correct the movement route of the bending bar BB on the basis of the comparison results. The control unit 100 may control, based on the comparison results at the calculating unit 120, the driving unit 130 to move the bending bar BB according to a corrected movement route.

Next, the description will be provided with reference to FIG. 2. In an exemplary embodiment, a standard line SL may be defined at one end of the stage ST. However, the position of the standard line SL is not limited thereto, and may vary depending on the specific structure of the device.

The movement route of the bending bar BB may be represented with coordinates. The movement route of the bending bar BB measured by the measuring unit CA may include coordinates indicating positions of the bending bar BB in the bending process. For example, each of the coordinates may be defined as a first distance y1 between the standard line SL and the bending bar BB. The coordinate of the bending bar BB may vary during the bending process.

For example, the first distance y1 may be a distance between one side of the bending bar BB and the standard line SL, or may be a distance between the central portion of the bending bar BB and the standard line SL as shown in FIG. 2. For another example, a standard mark may be formed on a given portion of the bending bar BB, and the first distance y1 may be measured as a distance between the standard line SL and the standard mark.

That is, when considering based on FIG. 2, the standard line SL may be an origin, and the value of the y-coordinate of the bending bar BB may be −y1.

Subsequently, the operation of the bending apparatus according to an exemplary embodiment will be described with reference to FIGS. 3 to 6.

Figure 3:
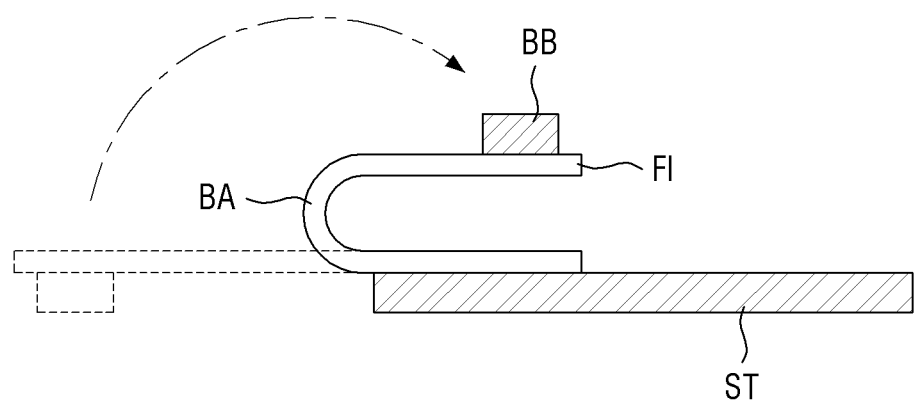
FIG. 3 is a side view of the bending apparatus when a bending object is bent.

FIG. 3 is a side view of the bending apparatus when a bending object is bent.

Referring to FIG. 3, the bending bar BB may bend the film member FI, by coming into contact with one side of the film member FI to push up the film member FI or pull the film member FI. The bending bar BB may be disposed to face the stage ST in a state in which the bending is completed. When the bending is completed, a bending area BA may be formed in the film member FI.

The bending bar BB may be driven by the driving unit 130. That is, the driving unit 130 may move the bending bar BB. In an exemplary embodiment, the driving unit 130 may be controlled by the control unit 100.

In an exemplary embodiment, the bending of the bending bar BB may be performed several times. In the primary bending process, the control unit 100 commands the driving unit 130 to move the bending bar BB along the standard route. However, the actual movement route of the bending bar BB may differ from the standard route, and the control unit 100 (specifically, the calculating unit 120) may correct the movement of the bending bar BB by comparing such a difference. Hereinafter, the movement route correction of the bending bar BB will be described in detail.

Figure 4:
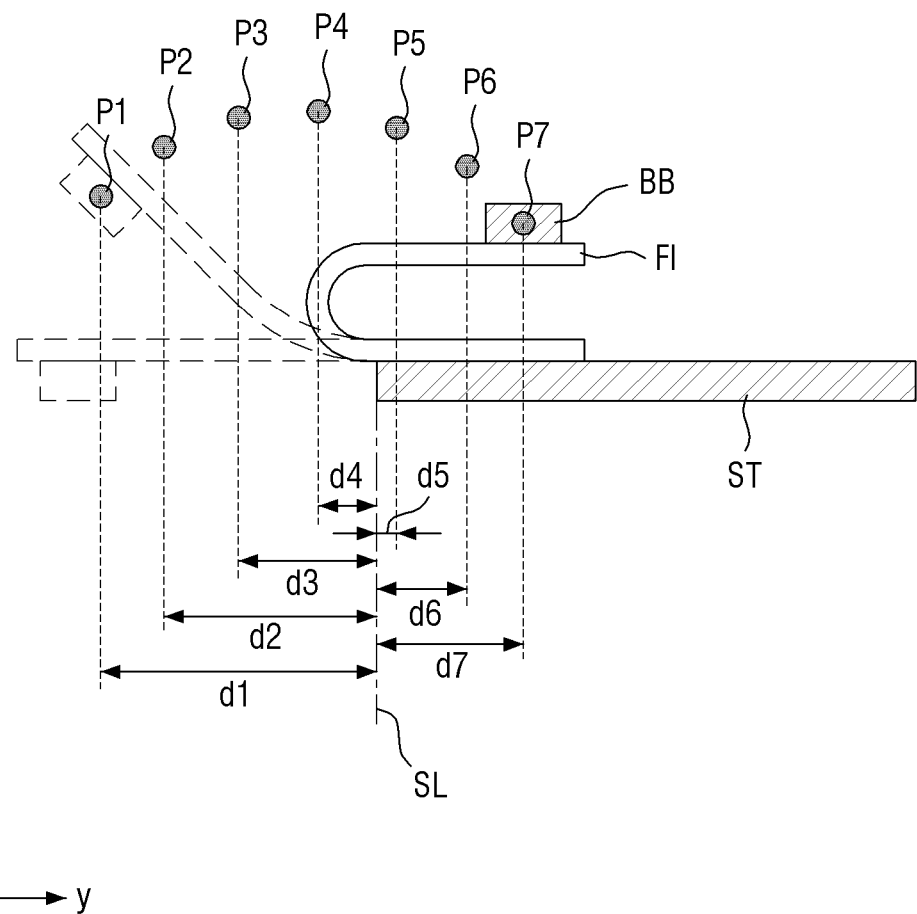
FIG. 4 is a side view for explaining the operation of the bending apparatus according to an exemplary embodiment.

FIG. 4 is a side view for explaining the operation of the bending apparatus according to an exemplary embodiment.

Referring to FIG. 4, the measuring unit CA may measure the position of the bending bar BB at predetermined time intervals. That is, a first measurement point P1 to a seventh measurement point P7 are obtained by measuring the positions of the bending bar BB at predetermined time intervals. Although FIG. 4 illustrates a case where there are seven (7) measurement points, which is merely an example, the number of measurement points may be less than 7 or may be greater than 7 in accordance with the measurement time intervals.

For descriptive convenience, an initial state and a termination state will be defined. The initial state may be defined as a state before the bending is started. The termination state may be defined as a state after the bending is started and the particular process is completed. The bending bar BB may bend the film member FI from the initial state to the termination state in each of the bending processes.

Measurement in the measuring unit CA may be performed between the initial state and the termination state. However, the point of time at which the measuring unit CA starts the measurement may be varied as required. This will be described below in detail.

The positions of each measurement point may be represented by the y-coordinate (the distance between the standard line SL and the bending bar BB). For example, the position of the first measurement point P1 may be −d1, the position of the second measurement point P2 may be −d2, the position of the third measurement point P3 may be −d3, the position of the fourth measurement point P4 may be −d4, the position of the fifth measurement point P5 may be d5, the position of the sixth measurement point P6 may be d6, and the position of the seventh measurement point P6 may be d7. In the present specification, symbols "−" and "+" are based on the standard line SL, and the positions of each measurement point may refer to the relative positions.

In an exemplary embodiment, the distance between adjacent measurement points may be the same. That is, the bending bar BB may move at a constant speed. However, the inventive concepts are not limited thereto, and the movement of the bending bar BB may include the acceleration section and the constant speed section in other exemplary embodiments, such as the one described below in detail with reference to FIG. 8.

Figure 5:
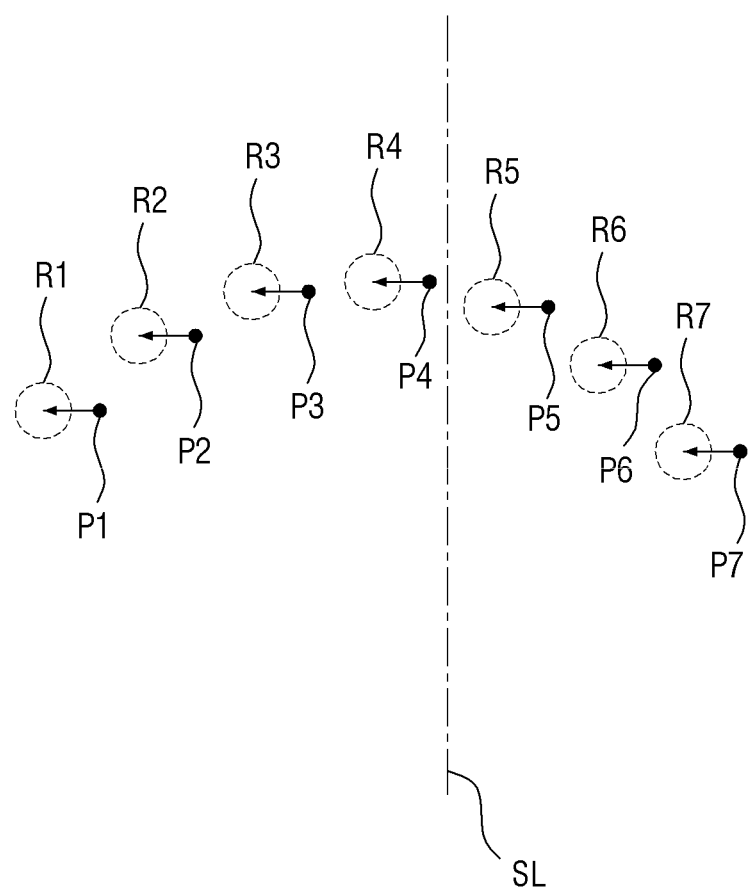
FIG. 5 is a conceptual diagram illustrating standard points and measurement points.

FIG. 5 is a conceptual diagram illustrating standard points and measurement points.

Referring to FIG. 5, the standard route may include a plurality of standard points. FIG. 5 illustrates a case where there are seven standard points R1 to R7 corresponding to the seven measurement points P1 to P7, respectively, but number of standard points is not limited thereto.

The standard point may be a specific value or a specific range. FIG. 5 illustrates a case where the standard point has a specific range. In other words, if the measurement point is positioned in the range of the standard point, it is possible to determine that the movement of the bending bar BB is performed along the standard route.

At least some of the first measurement point P1 to the seventh measurement point P7 may deviate from the standard point. FIG. 5 illustrates the case where all the seven measurement points deviate from the range of the standard point, but is not limited thereto, all the seven measurement points may be positioned in the range of the standard point, or some of the seven measurement points may deviate from the standard point.

If the actual movement route of the bending bar BB deviates from the standard route, damage may occur in the bending area BA of the film member FI. According to an exemplary embodiment, the movement route of the bending bar BB is corrected so that the bending bar BB moves along the standard route when the movement route of the bending bar BB deviates from the standard route. For example, target positions for moving the bending bar BB is corrected, and the bending bar BB may be controlled to move according to the corrected movement route which includes the target positions so that the bending bar BB moves along the standard route. For example, the bending bar BB may be positioned to move in the direction of the arrows from the measurement points P1 to P7 into the standard point according to the corrected movement route.

The calculating unit 120 may measure the degree to which the measurement point deviates from the standard point by comparing the measurement point with the standard point. The control unit 100 may correct the position of the bending bar BB on the basis of the degree. Specifically, it is possible to correct the position coordinates (y-coordinates in FIG. 5) of the bending bar BB.

Subsequently, the operation of the bending apparatus according to an exemplary embodiment will be described with reference to FIG. 6.

Figure 6:
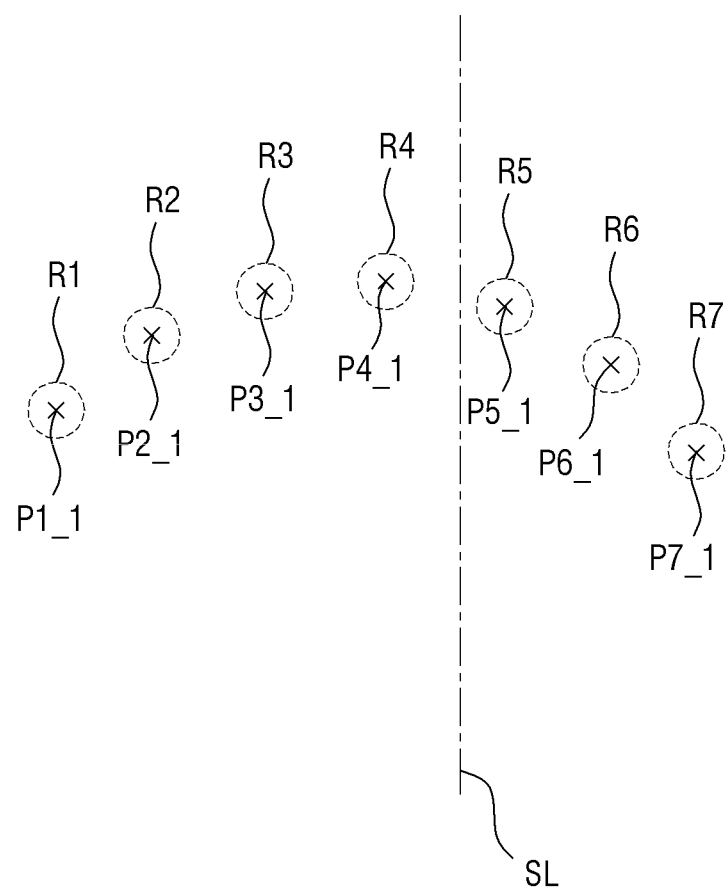
FIG. 6 is a conceptual diagram illustrating standard points and measurement points after correcting a movement route according to an exemplary embodiment.

FIG. 6 is a conceptual diagram illustrating standard points and measurement points after correcting a movement route according to an exemplary embodiment.

The position correction of the bending bar BB may be performed in a state in which the bending bar BB is restored to its initial state after the primary bending process. The secondary bending may be performed by correcting the position of the bending bar BB.

FIG. 6 illustrates a case where all the measurement points P1_1 to P7_1 are positioned in the range of the standard points R1 to R7 in the secondary bending, however, the embodiments are not limited thereto. For instance, in the secondary bending, at least some of the measurement points may deviate from the standard points. In this instance, the tertiary bending process may be further performed correcting the position of the bending bar BB. By repeatedly performing the bending multiple times, the movement route and the standard route of the bending bar BB may be made to match each other.

Subsequently, a bending apparatus according to another embodiment will be described. In the following examples, the same configurations as the aforementioned configurations will be denoted by the same reference numbers, and the repeated description will be omitted or simplified.

Figure 7:
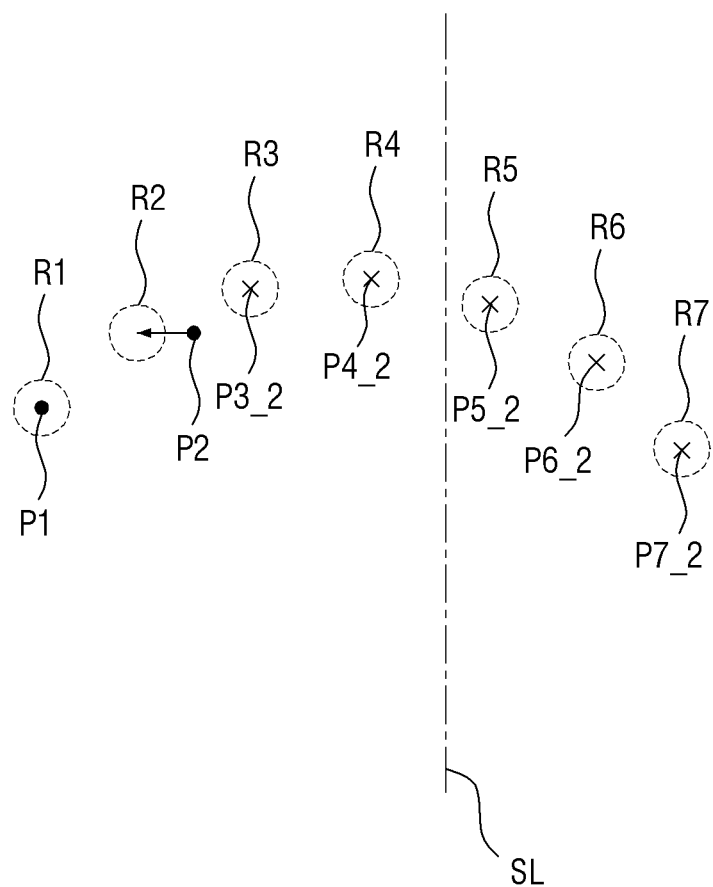
FIG. 7 is a conceptual diagram illustrating standard points and measurement points according to an exemplary embodiment.

FIG. 7 is a conceptual diagram illustrating standard points and measurement points according to an exemplary embodiment.

Referring to FIG. 7, a bending apparatus is different from the embodiments of FIGS. 5 and 6 in that the position of the bending bar BB is corrected in real time during bending.

The position correction of the bending bar BB may be performed in real time.

Specifically, the measurement point deviating from the standard point may be measured during the bending process. FIG. 7 illustrates a case where the second measurement point P2 deviates from the second standard point R2. At this time, the calculating unit 120 calculates the degree to which the second measurement point P2 deviates from the second standard point R2, and the control unit 100 may command the driving unit 130 to correct the position of the bending bar BB based on the degree. That is, by instantaneously correcting the position of the bending bar BB, it is possible to correct the position (i.e., the y-coordinate) of the bending bar BB so that the bending bar BB follows the standard route before the next measurement point P3_2.

FIG. 7 illustrates a case where the measurement points P3_2 to P7_2 are positioned in the standard points R3 to R7 after the position of the bending bar BB is corrected. However, the embodiments are not limited thereto, and another measurement point may deviate from the standard point. In this case, the aforementioned process may be performed again. That is, the correction of the position of the bending bar BB may be performed one or more times in the primary bending process by the control unit 100.

Figure 8:
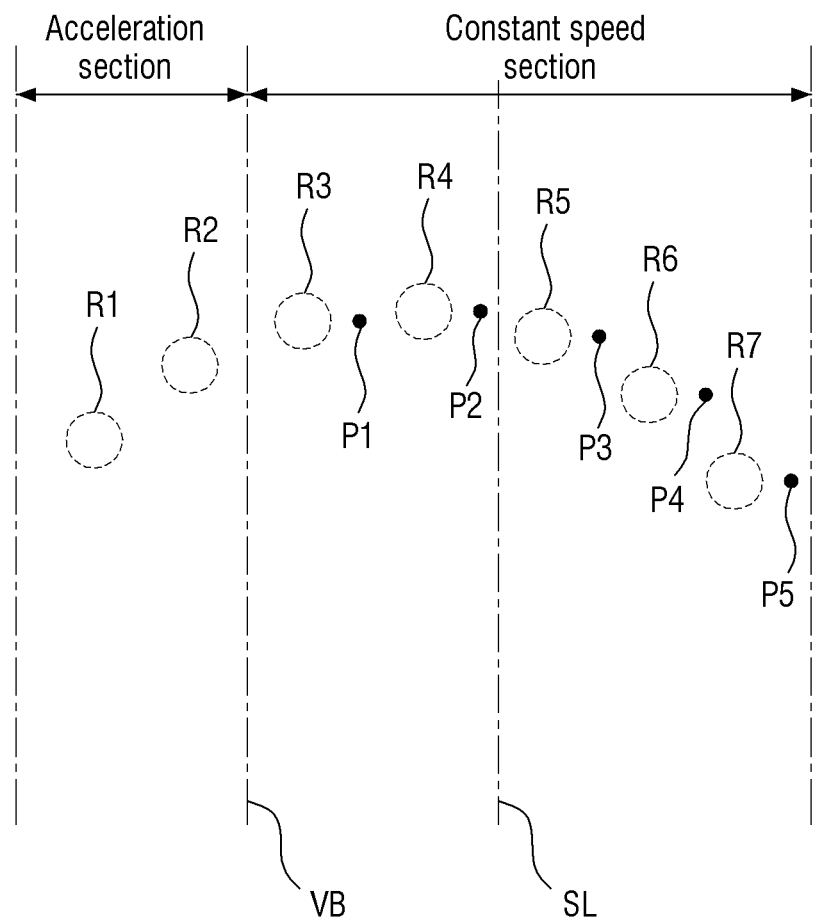
FIG. 8 is a conceptual diagram illustrating measurement points in a constant speed section.

FIG. 8 is a conceptual diagram illustrating measurement points in a constant speed section.

Referring to FIG. 8, the movement route of the bending bar BB includes an acceleration section and a constant speed section.

The moving speed of the bending bar BB between the initial state and the termination state may be kept constant after the gradual increase. That is, the movement of the bending bar BB may include an acceleration section in which the moving speed increases, and a constant speed section in which the moving speed is constant.

In an exemplary embodiment, the measuring unit CA may measure the movement route of the bending bar BB after the bending bar BB enters the constant speed section. That is, the signal unit 110 may provide a start signal to the measuring unit CA, when the bending bar BB enters the constant speed section. The measuring unit CA may start the measurement in response to the start signal provided from the signal unit 110.

FIG. 8 illustrates a case where the first to fifth measurement points P1 to P5, which correspond to third to seventh standard points R3 to R7, are measured to after entering a velocity boundary VB between the acceleration section and the constant speed section.

The bending apparatus may correct the position of the bending bar BB on the basis of the movement route information measured in the constant speed section.

Figure 9:
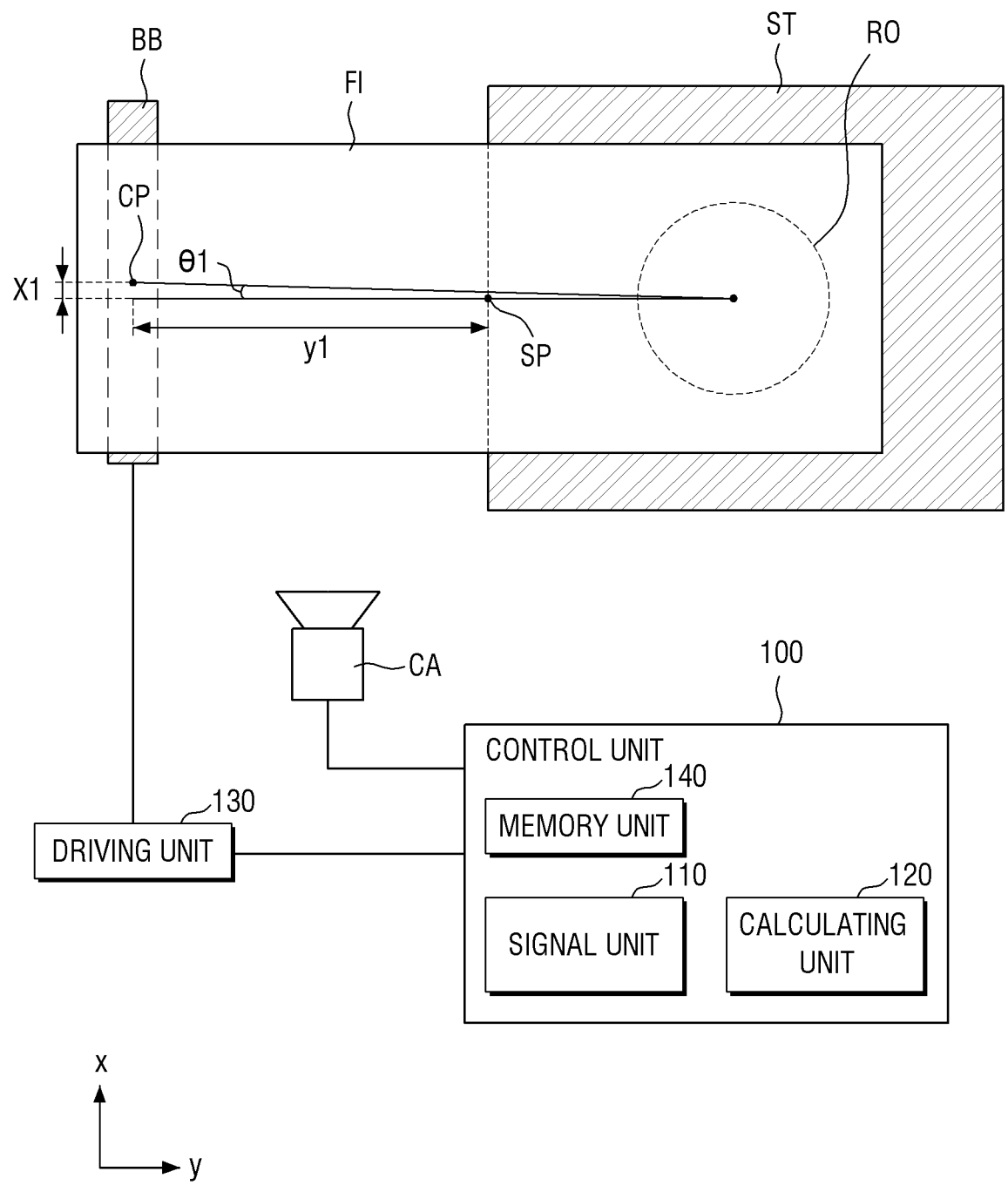
FIG. 9 is a top view of a bending apparatus according to another exemplary embodiment.
Figure 10:
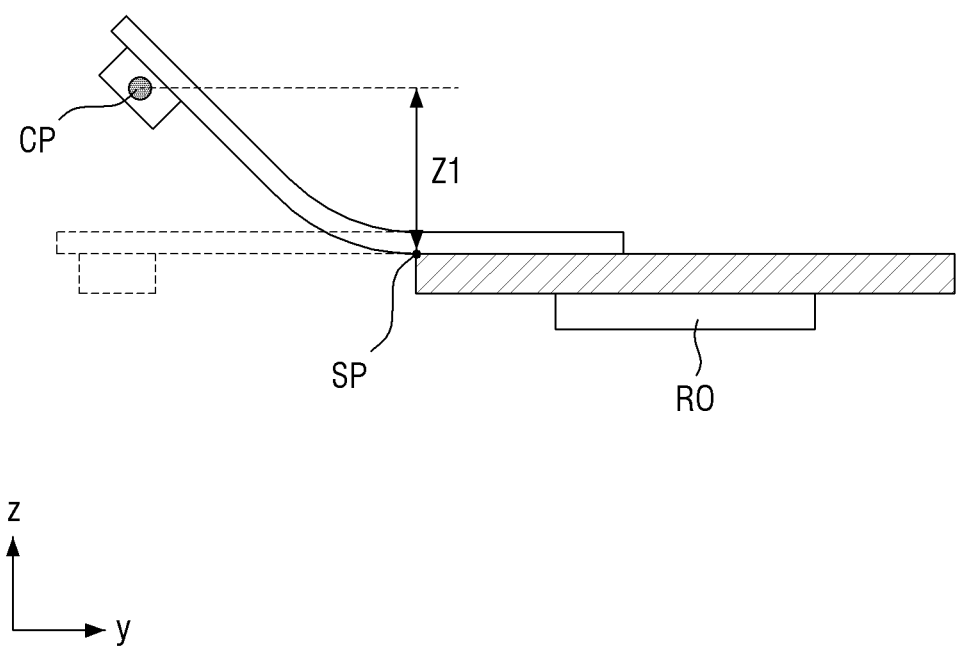
FIG. 10 is a side view of the bending apparatus according to the exemplary embodiment of FIG. 9.

FIG. 9 is a top view of a bending apparatus according to another exemplary embodiment. FIG. 10 is a side view of the bending apparatus according to the exemplary embodiment of FIG. 9. FIG. 11 is a table illustrating coordinates of measurement points.

Referring to FIGS. 9 to 11, the bending apparatus may further include a rotary driving unit RO. The rotary driving unit RO may be controlled by the control unit 100, and may rotate the stage ST on the x-y plane.

The position of the bending bar BB is represented using the four coordinates. The standard point SP is defined at one end of the stage ST. A central point CP for determining the position of the bending bar BB is defined. The center point CP may be disposed in a central portion of the bending bar BB, but is not limited thereto, and may be located at another position if desired.

The y-coordinate is defined substantially similarly to the coordinate described in FIG. 2. That is, in FIG. 9, the y-coordinate of the center point CP based on the standard point SP as the origin is −y1. The x-coordinate may mean the distance in the x-axis direction between the center point CP and the standard point SP. That is, the x-coordinate of the center point CP is x1 in FIG. 9.

The z-coordinate may mean the height of the bending bar BB (see FIG. 10). That is, the z-coordinate of the center point CP is z1.

A θ-coordinate may be defined as an angle formed between a line connecting the standard point SP and the center of the rotary driving unit RO and a line connecting the center point CP and the center of the rotary driving unit RO. That is, the θ-coordinate of the center point CP is θ1.

That is, the coordinates of the center point in FIG. 9 and FIG. 10 may be expressed by (x1, y1, z1 and θ1).

The control unit 100 may track the movement route of the bending bar BB using these coordinates. Further, the control unit 100 may correct the movement route by changing the coordinates of the bending bar BB. The control unit 100 may control the bending bar BB and the rotary driving unit RO to change the x-coordinate, the y-coordinate, the z-coordinate, and the θ-coordinate.

The standard route and the movement route may be stored or measured in the form of Table as illustrated in FIG. 11. In the table of FIG. 11, the term "designation" refers to the relative value of the position of the standard route, and the term "current" refers to the value of the measured route. Further, P1 to P7 refers to the measurement points that are measured in the measuring unit CA.

FIG. 11 illustrates a case where the x-coordinate and the z-coordinate deviate from the value of the standard route at the first measurement point P1 and the second measurement point P2. In this case, the control unit 100 may command the driving unit 130 to correct the position of the bending bar BB. Specifically the control unit 100 may command the correction of the x-coordinate and/or the z-coordinate of the bending bar BB that deviates from the standard route.

The position correction of the bending bar BB may be performed after the primary bending process and before the secondary bending process as described above (see FIG. 6), or may be performed in real time during the bending process (see FIG. 7). The position correction may be performed once or more, as described in FIGS. 6 and 7.

FIGS. 9 to 11 illustrate a case of using four coordinates for indicating each position, but the number of available coordinates is not limited thereto. For example, the bending apparatus may use four or less coordinates or may use five or more coordinates.

Figure 12:
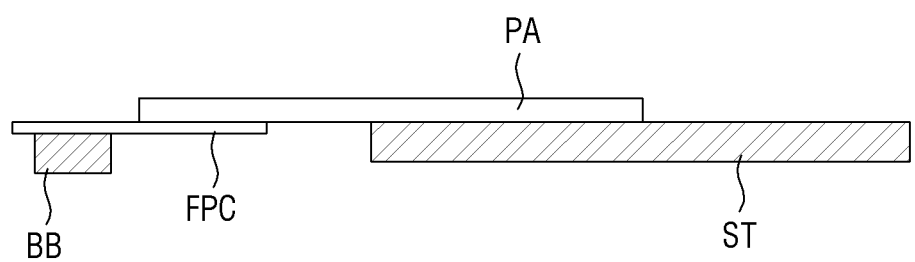
FIG. 12 is a side view of a bending apparatus according to another exemplary embodiment.
Figure 12:
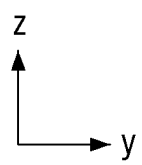
Figure 13:
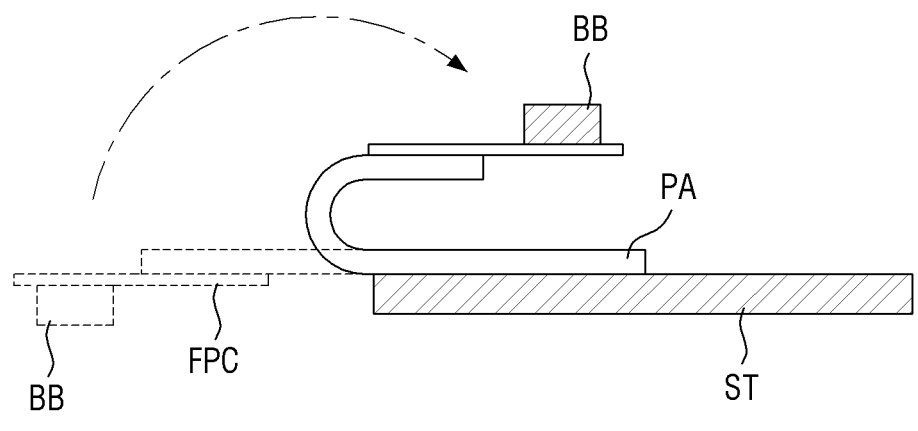
FIG. 13 is a side view of the bending apparatus of FIG. 12 when a bending object is bent.
Figure 13:
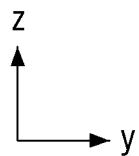
Figure 14:
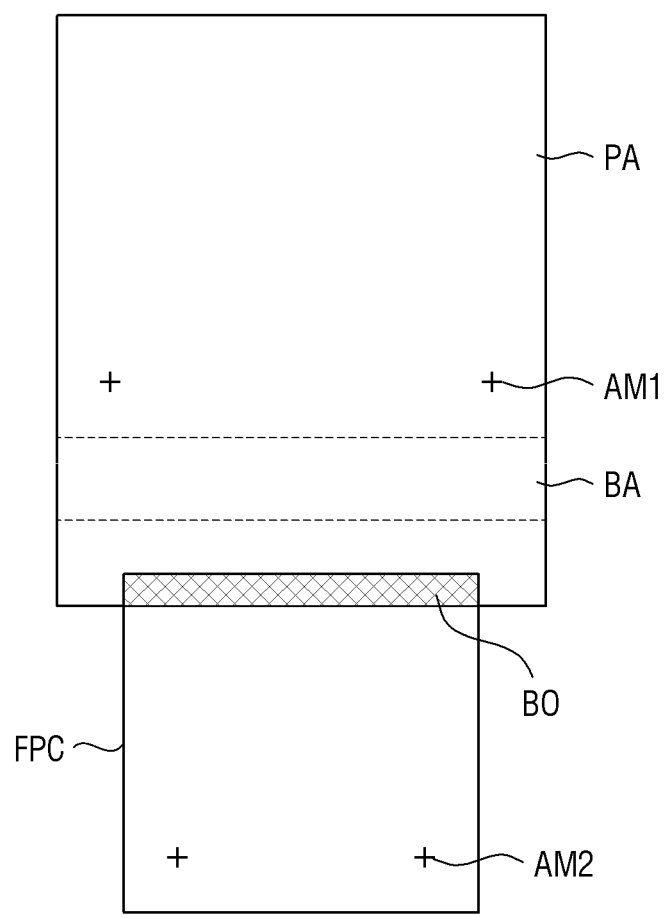
FIG. 14 is a partial top view of FIG. 12.

FIG. 12 is a side view of a bending apparatus according to another exemplary embodiment. FIG. 13 is a side view of the bending apparatus of FIG. 12 when a bending object is bent. FIG. 14 is a partial top view of FIG. 12.

Referring to FIG. 12, the bending object includes a panel PA and a flexible printed circuit board FPC.

The panel PA may include a display panel, a touch screen panel and/or a touch unit. The panel PA may be capable of flexibility. In other words, the panel PA may be bent, folded or rolled by having a bendable, foldable or rollable material or structure.

The flexible printed circuit board FPC may be a circuit board having flexibility. The flexible printed circuit board FPC is attached to one side of the panel PA, and may provide signals to the panel PA.

The bending bar BB may be in contact with and fixed to one side of the flexible printed circuit board FPC.

Referring to FIG. 13, in an exemplary embodiment, the bending bar BB may contact one side of the flexible printed circuit board FPC and push up or pull the flexible printed circuit board FPC when the bending bar BB moves. The panel PA may be bent according to the movement of the bending bar BB. In the termination state, the bending bar BB and the flexible printed circuit board FPC may be disposed to face the stage ST. In the termination state, the bending area BA may be formed in the panel PA.

Referring to FIG. 14, the flexible printed circuit board FPC may be attached to one side of the panel PA, specifically, a contact portion BO. Although it is not illustrated, the panel PA and the flexible printed circuit board FPC may contact each other through an anisotropic conductive film (ACF). In this instance, the panel PA and the flexible printed circuit board FPC may be electrically connected to each other.

In order to check the alignment in the termination state, an alignment mark may be formed in the panel PA and/or the flexible printed circuit board FPC. FIG. 14 illustrates a case where a first alignment mark AM1 is formed on the panel PA and a second alignment mark AM2 is formed on the flexible printed circuit board FPC. By checking whether the first alignment mark AM1 and the second alignment mark AM2 are aligned in the termination state, it is possible to check whether the panel PA and the flexible printed circuit board FPC are aligned.

Figure 15:
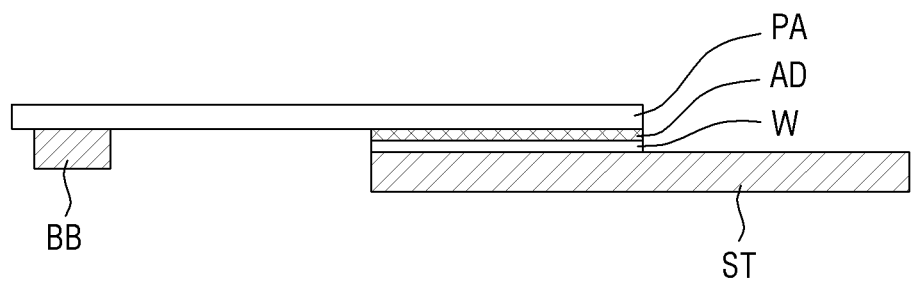
FIG. 15 is a side view of a bending apparatus according to still another exemplary embodiment.
Figure 15:
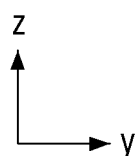
Figure 16:
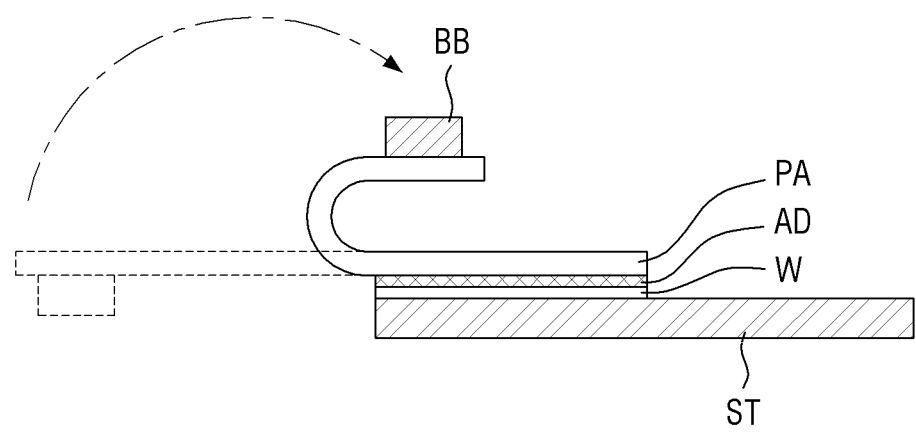
FIG. 16 is a side view of the bending apparatus of FIG. 15 when a bending object is bent.
Figure 16:
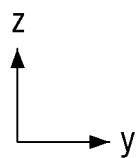

FIG. 15 is a side view of a bending apparatus according to still another exemplary embodiment. FIG. 16 is a side view of the bending apparatus of FIG. 15 when a bending object is bent.

Referring to FIGS. 15 and 16, the bending object includes a window W and a panel PA.

The window W can be a cover window that is used in the display device. That is, the window W may be formed of a transparent material through which light passes. The window, for example, may be formed to include at least one of glass or transparent plastic.

FIG. 15 illustrates a case where the window W includes a single layer, but the structure of the window W is not limited thereto. For example, the window W may have a laminated structure in which a plurality of functional layers is laminated.

An adhesive layer AD may be interposed between the window W and the panel PA. That is, the window W and the panel PA may be glued together by the adhesive layer AD.

In an exemplary embodiment, the adhesive layer AD may include a photocurable resin or a thermosetting resin having high transmittance and adhesive performance in the embodiment. For example, the adhesive layer AD may be formed by irradiating with ultraviolet (UV) to cure the resin, after applying resin such as acryl. In another embodiment, the adhesive layer AD may be configured to include an optically clear adhesive (OCA).

In an exemplary embodiment, the panel PA may have an area greater than the window W. That is, the panel PA may partially overlap the window W.

The bending bar BB may bend the panel PA, by coming into contact with the one side of the panel PA to push up the panel PA. The bending bar BB may be disposed to face the stage ST in the termination state. In the termination state, a bending region BA may be formed on the panel PA.

Figure 17:
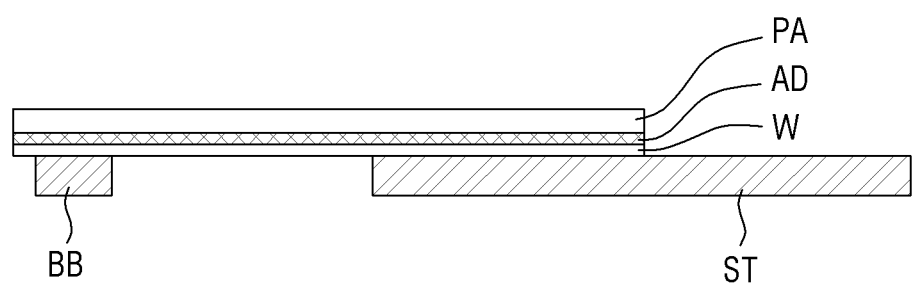
FIG. 17 is a side view of a bending apparatus according to still yet another exemplary embodiment.
Figure 18:
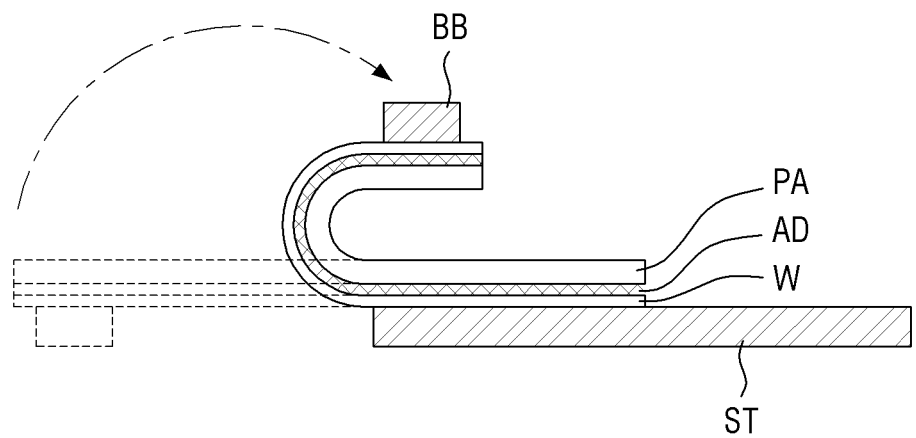
FIG. 18 is a side view of the bending apparatus of FIG. 17 when a bending object is bent.

FIG. 17 is a side view of a bending apparatus according to still yet another exemplary embodiment. FIG. 18 is a side view of the bending apparatus of FIG. 17 when a bending object is bent.

Referring to FIGS. 17 and 18, the bending object includes a window W and a panel PA In an exemplary embodiment, the window W may be bent together with the panel PA. The window W may have flexible properties. In other words, the window W and the panel PA may be bent, folded or rolled by having a bendable, foldable or rollable material or structure.

Referring to FIG. 18, the bending bar BB may bend the window W and panel PA, by coming into contact with one side of the window W to push up the window W. Thus, in the termination state, the bending bar BB may be disposed to face the stage ST.

When the bending is completed, a bending area may be formed in the window W and the panel PA.

Figure 19:
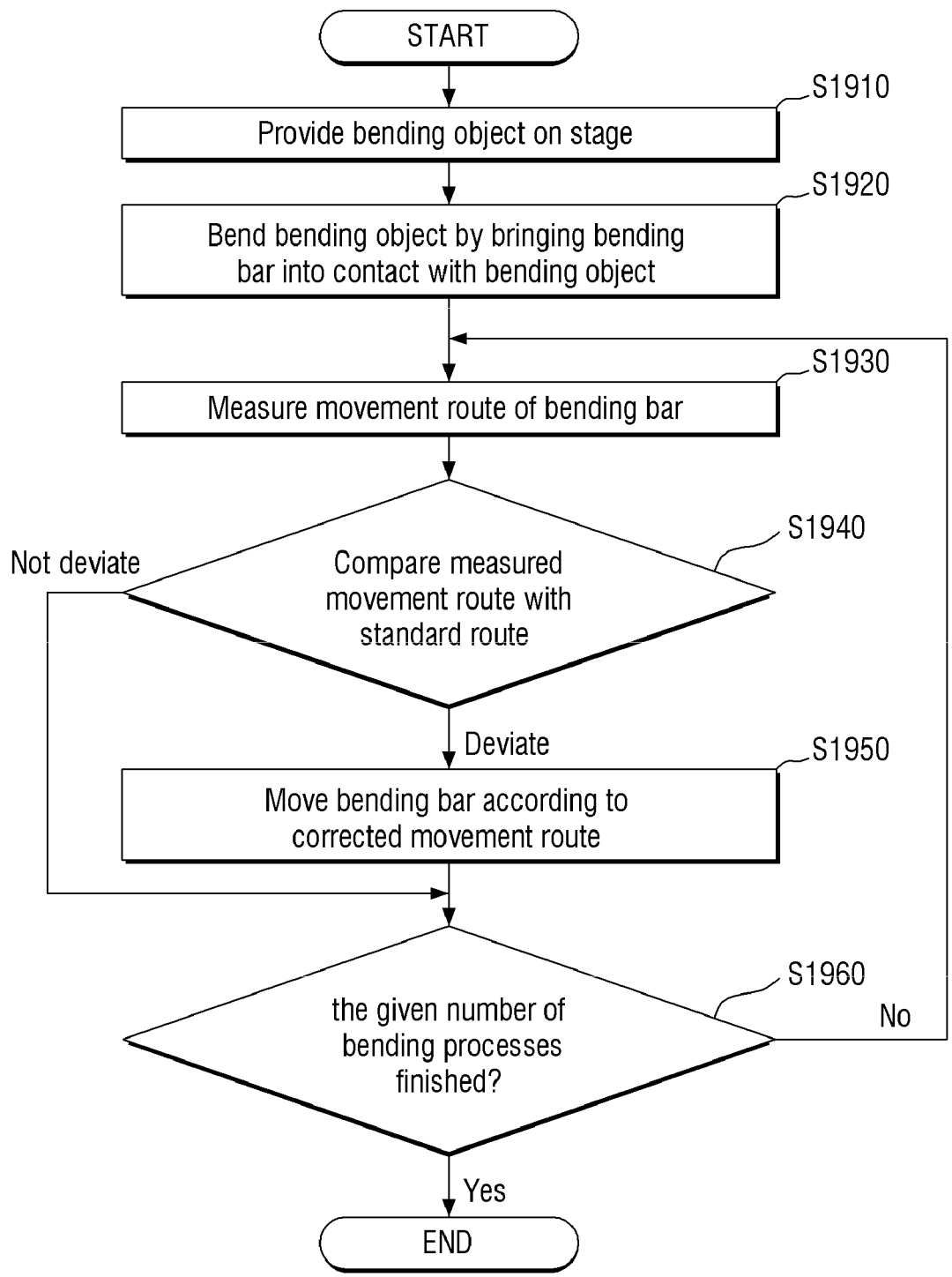
FIG. 19 is a flow chart of a manufacturing process in accordance with an exemplary embodiment.

Hereinafter, a method for manufacturing the display device according to an exemplary embodiment will be described with respect to FIG. 19. In the following embodiment, the same configurations as the aforementioned configurations are denoted by the same reference numbers, and the repeated description will be simplified or omitted.

The method for manufacturing the display device according to an exemplary embodiment includes a step of providing a bending object on a stage ST, a step of bending the bending object by bringing the bending bar BB into contact with the bending object, and a step of measuring the movement route of the bending bar BB.

The method for manufacturing the display device according to an exemplary embodiment may be performed by the bending apparatus according to the aforementioned exemplary embodiments. However, the embodiments are not limited thereto.

The method for manufacturing the display device according to an exemplary embodiment may include the operation steps of the bending apparatus according to the aforementioned exemplary embodiments.

First, the step of providing the bending object on the stage ST (S1910) is performed. The stage ST and the bending object may be substantially identical to those described in the bending apparatus according to exemplary embodiments.

Next, the step of bending the bending object by bringing the bending bar BB into contact with the bending object (S1920) may be performed. The bending bar BB may bend the bending object, by coming into contact with at least one side of the bending object to push up the bending object or pull the bending object (see FIG. 3 or the like).

Then, the step of measuring the movement route of the bending bar BB (S1930) may be performed.

The movement route of the bending bar BB may be represented by coordinates. For example, each position of the movement route of the bending bar BB may be represented by a single coordinate (see FIG. 4) or may be represented by a plurality of coordinates (see FIGS. 9 to 11).

As described above, the movement route of the bending bar BB may include the acceleration section and the constant speed section. In this case, the step of measuring the movement route of the bending bar BB may be a step of measuring the movement route of the bending bar BB at the constant speed section (see FIG. 8).

The method for manufacturing the display device according to an exemplary embodiment may further include a step of comparing the measured movement route with the standard route (S1940). The step of comparing the measured movement route with the standard route may be performed by the calculating unit 120, but is not limited thereto (see FIG. 5 or the like).

The method for manufacturing the display device according to an exemplary embodiment may further include a step of moving the bending bar BB according to a corrected movement route (S1950) when the measured movement route deviates from the standard route. The corrected movement route may include coordinates of the bending bar BB.

The position correction of the bending bar BB may be performed after the primary bending process and before the secondary bending process (see FIGS. 5 and 6), or may be performed in real time during a single bending process (see FIG. 7)

The position correction of the bending bar BB may be performed once or more during at least one bending process or after completion of one primary bending process.

A step of determining whether the given number of bending processes is finished is performed (S1960). According to the result, step S1930 may be performed. Steps S1930 to S1950 may be repeatedly performed until the given number of bending processes is finished (S1960).

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method for manufacturing a display device, the method comprising:
   providing an object on a stage;
   bending the object by bringing a bar into contact with the object; and
   measuring a movement route of the bar,
   wherein the movement route of the bar comprises an acceleration section in which a moving speed of the bar increases, and a constant speed section in which the moving speed of the bar is constant.

2. The method of claim 1, wherein the measuring the movement route of the bar comprises measuring the movement route of the bar in the constant speed section.

3. The method of claim 1, wherein the object is a film member on which electronic elements are mounted.

4. The method of claim 1, wherein the object comprises a panel, and a flexible printed circuit board attached to the panel.

5. The method of claim 4, wherein the bar contacts the flexible printed circuit board.

6. The method of claim 1, wherein the object comprises a panel, and a window disposed on the panel.

7. The method of claim 6, wherein the bar contacts the panel.

8. The method of claim 6, wherein the bar contacts the window.

9. The method of claim 1, wherein the bending of the object comprises moving the bar along a standard route.

10. The method of claim 9, further comprising comparing the measured movement route with the standard route.

11. A method for manufacturing a display device, the method comprising:
    providing an object on a stage;
    bending the object by bringing a bar into contact with the object; and
    measuring a movement route of the bar,
    wherein the bending of the object comprises moving the bar along a standard route, and further comprising:
    comparing the measured movement route with the standard route; and
    moving the bar according to a corrected movement route when the measured movement route deviates from the standard route.

12. The method of claim 11, wherein the moving the bar according to the corrected movement route is performed in real time, while bending the object.

13. The method of claim 11, wherein:
    the measured movement route comprises at least one coordinate indicating a position of the bar; and
    the corrected movement route comprises at least one target coordinate.

14. A method of manufacturing a display device, the method comprising:
    providing an object on a stage;
    moving a bar along at least a portion of a given route to bend the object, the bar contacting the object;
    measuring a movement route of the bar when the bar moves; and
    correcting the given route with a corrected movement route based on the measured movement route.

15. The method of claim 14, wherein:
    the given route comprises first coordinates and second coordinates; and
    the moving the bar comprises moving the bar along the first coordinates.

16. The method of claim 15, further comprising:
    moving the bar according to third coordinates of the corrected route, the third coordinates corresponding to the second coordinates.

17. The method of claim 14, further comprising moving the bar according to first coordinates of the corrected route, wherein the given route comprises second coordinates, and the first coordinates corresponds to the second coordinates.

18. The method of claim 14, wherein:
    the movement route of the bar comprises an acceleration section in which a moving speed of the bar increases, and a constant speed section in which the moving speed of the bar is constant, and the movement route is measured in the constant speed section.

* * * * *